(12) United States Patent
Yoshida

(10) Patent No.: US 6,268,234 B1
(45) Date of Patent: Jul. 31, 2001

(54) SOLID STATE IMAGING DEVICE

(75) Inventor: Hiroyuki Yoshida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/334,664

(22) Filed: Jun. 17, 1999

(30) Foreign Application Priority Data

Jun. 29, 1998 (JP) ................................. 10-182237

(51) Int. Cl.[7] ................................................ H01L 21/00
(52) U.S. Cl. .................. 438/60; 438/57; 438/59; 438/73; 438/75
(58) Field of Search .................. 438/57, 59, 60, 438/73, 74, 75, 76

(56) References Cited

U.S. PATENT DOCUMENTS 4,831,426 * 5/1989 Kimata et al. ........................ 257/222
5,132,762 * 7/1992 Yamada .............................. 257/440

* cited by examiner

Primary Examiner—Vu A. Le
Assistant Examiner—Christian D. Wilson
(74) Attorney, Agent, or Firm—Sonnenschein, Nath & Rosenthal

(57) ABSTRACT

Readout gate sections are formed by implanting an impurity there and into photosensors at the same time by utilizing a step of implanting an impurity for increase of the transfer efficiency of vertical CCD registers. As a result, the potential of the regions under the gate electrodes of the readout gate sections can be set at an optimum value without being influenced by misregistration of photomasks.

10 Claims, 8 Drawing Sheets

- OCCURRENCE OF DECREASE IN AMOUNT OF CHARGE HANDLED, TRANSFER FAILURE, AND OTHER FAILURES DUE TO SHORTENING OF EFFECTIVE VERTICAL CCD REGISTER WIDTH
- INCREASE IN FAILURE RATE DUE TO DISPERSION

· INCREASE IN LEAKAGE FAILURE RATE DUE TO SHORTENED READOUT GATE LENGTH AND OCCURRENCE OF OTHER FAILURES
· INCREASE IN FAILURE RATE DUE TO DISPERSION

▨ VERTICAL/HORIZONTAL CCD REGISTER FORMING IMPURITY REGION (RELATIVE) DEVIATION BETWEEN IMPURITY REGIONS

▨ POTENTIAL IS DEEP LOCALLY (RELATIVE) DEVIATION BETWEEN IMPURITY REGIONS

▨ POTENTIAL IS SHALLOW LOCALLY

SOLID STATE IMAGING DEVICE

BACKGROUND OF THE INVENTION

1. Field of the Invention

The present invention relates to a solid-state imaging device and particularly to the structure of a readout gate section of a unit pixel of a solid-state imaging device.

2. Description of the Related Art

FIG. 1 shows the configuration of an interline transfer CCD (charge coupled device) solid-state imaging device as an example of solid-state imaging devices.

As shown in FIG. 1, an effective pixel section 101 is constituted of a plurality of photosensors 102 and a plurality of vertical CCD registers 103. The photosensors 102 are arranged two-dimensionally in matrix form, each of which converts incident light to a signal charge of a charge amount corresponding to the quantity of the incident light and stores the signal charge. Each vertical CCD register 103 is provided for the associated vertical column of the photosensors 102 and vertically transfers signal charges that are read out from the respective photosensors 102 via respective readout gate sections (not shown).

Signal charges that have been read into the vertical CCD registers 103 are shifted into a horizontal CCD register 104 by portions corresponding to one scanning line (one line) in part of a horizontal blanking period. The signal charges of one scanning line are sequentially transferred in the horizontal direction in the horizontal CCD register 104 and then converted to an output signal voltage by, for example, a charge detection section 105 having the floating diffusion amplifier configuration.

FIG. 2 is a plan pattern diagram showing the configuration of one photosensor 102 and its peripheral portion (region A in FIG. 1). FIG. 3 shows a sectional structure taken along line Y–Y' in FIG. 2 and FIG. 4 shows its potential profile.

In the photosensor 102, a storage/readout control on a signal charge produced by photoelectric conversion is performed by a potential variation at a readout gate section 106 that exists between the photosensor 102 and the vertical CCD register 103. Since a first-layer transfer electrode 107-1 of the vertical CCD register 103 also serves as a gate electrode 108 of the readout gate section 106, vertical transfer pulses Vφ take 3-value levels.

That is, as shown in a waveform diagram of FIG. 5, repetitive pulses having a low level VφL and a high level VφH serve as vertical transfer pulses that are applied to the transfer electrodes 107-1 and 107-2 of the vertical CCD register 103. Pulses having a level VφT that is even higher than the high level VφH serve as readout clock pulses that are applied to the gate electrode 108 of the readout gate section 106. As a result, the gate potential of the readout gate section 106 becomes VφT during the signal charge readout period and repeatedly becomes VφL and VφH during the transfer period of the vertical CCD register 103.

The potential of the region under the gate electrode 108 of the readout gate section 106 should have a proper value with respect to the prescribed readout clock voltage VφT during the signal charge readout period and with respect to the high level VφH of vertical transfer pulses during the non-readout period, that is, the transfer period of the vertical CCD register 103.

This is for the following reasons. In the signal charge readout period, a potential profile as shown in FIG. 6(A) should be established to assure complete signal charge readout. In the transfer period of the vertical CCD register 103, signal charge leakage to the vertical CCD register 103 as shown in FIG. 6(B) should absolutely be prevented even when the potential of the gate electrode 108 is at the high level VφH.

In setting the above potential values, the misregistration of photomask patterns should be prevented that may cause the above-mentioned leakage of stored charge and readout failure, an insufficient amount of charge handled and a transfer failure of the vertical CCD register 103, increases in the rates of those failures due to dispersion, and so forth.

However, if a mask dedicated to the readout gate sections 106 is used in setting the potential of the readout gate sections 106, it is difficult to freely adjust the impurity concentration and the mask patterns to the readout gate sections 106 because of small sizes of the mask patterns and other factors. Therefore, the potentials of the readout gate sections 106 and the photosensors 102 cannot be set at optimum values, causing the above-mentioned problems due to misregistration of mask patterns.

The problems due to misregistration of mask patterns will be described below. First, if the region of the readout gate section 106 deviates to the vertical CCD register 103 side as shown in FIG. 7(A), the effective width of the vertical CCD register 103 decreases as shown in FIG. 7(B), which may cause a reduction in the amount of charge handled, a transfer failure, and other failures. Further, the failure rate increases due to dispersion.

If the region of the readout gate section 106 deviates to the photosensor 102 side as shown in FIG. 8(A), the gate length of the gate electrode 108 is shortened as shown in FIG. 8(B), which may increase the rate of the failure of leakage of signal charge stored in the photosensor 102 and cause a reduction in the sensitivity of the photosensor 102 and other problems. Further, the failure rate increases due to dispersion.

On the other hand, as for the patterns of the vertical CCD registers 103 and the horizontal CCD register 104, an impurity is implanted simultaneously to the CCD registers 103 and 104 by using the same mask to prevent a failure in transferring signal charges from the vertical CCD registers 103 to the horizontal CCD register 104 due to misregistration of photomasks and other failures.

For example, if the impurity regions of the vertical CCD registers 103 deviate to the horizontal CCD register 104 side, the potential of the connecting portion of the registers 103 and 104 becomes deep locally as shown in FIG. 10(A). If gaps are formed between the vertical CCD registers 103 and the horizontal CCD register 104, the potential of the gap portions becomes shallow locally as shown in FIG. 10(B). These potential profiles may cause the above-mentioned transfer failure and other failures.

If impurity implantation is performed at the same concentration at the same time by using the same mask for the vertical CCD registers 103 and the horizontal CCD register 104 as descried above to prevent the transfer failure and other failures, it is difficult to provide an optimum potential for each of the vertical CCD registers 103 and the horizontal CCD register 104. This may result in a transfer failure, an insufficient amount of charge handled, and other failures.

SUMMARY OF THE INVENTION

The present invention has been made in view of the above problems and an object of the invention is therefore to solve the problems due to misregistration of mask patterns in forming readout gate sections and thereby provide a solid-state imaging device in which the potential of the readout gate sections is set at an optimum value.

The invention provides a manufacturing method of a solid-state imaging device having a plurality of photosensors arranged in columns, readout gate sections provided adjacent to the respective photosensors for reading out signal charges produced by the respective photosensors through photoelectric conversion, and transfer registers provided parallel with columns of the photosensors for transferring signal charges read out by the readout gate sections, the manufacturing method comprising the step of forming the readout gate sections by implanting an impurity into readout gate section forming regions and photosensor forming regions of a substrate at the same time in a device forming step in which an impurity is implanted into the substrate.

The invention also provides a manufacturing method of a solid-state imaging device having a plurality of photosensors arranged two-dimensionally in matrix form, readout gate sections provided adjacent to the respective photosensors for reading out signal charges produced by the respective photosensors through photoelectric conversion, a plurality of vertical transfer registers provided for respective columns of the photosensors for transferring signal charges read out by the readout gate sections, and a horizontal transfer register provided perpendicularly to the vertical transfer registers, the manufacturing method comprising the step of forming the readout gate sections by implanting an impurity into readout gate section forming regions and photosensor forming regions of a substrate at the same time in a device forming step in which an impurity is implanted into the substrate.

In the above manufacturing methods of a solid-state imaging device, since an impurity is implanted into the readout gate sections and the photosensors at the same time, the problem of misregistration of photomasks does not occur any more. Therefore, the potential of the readout gate sections can be set at an optimum value without being influenced by misregistration of photomasks. Further, by implanting an impurity into the vertical transfer registers and the readout gate sections at the same time, the potential of the vertical transfer registers can be set at its own optimum value separately from the horizontal transfer register.

DETAILED DESCRIPTION OF THE PREFERRED EMBODIMENTS

Embodiments of the present invention will be hereinafter described with reference to the accompanying drawings.

Figure 1:
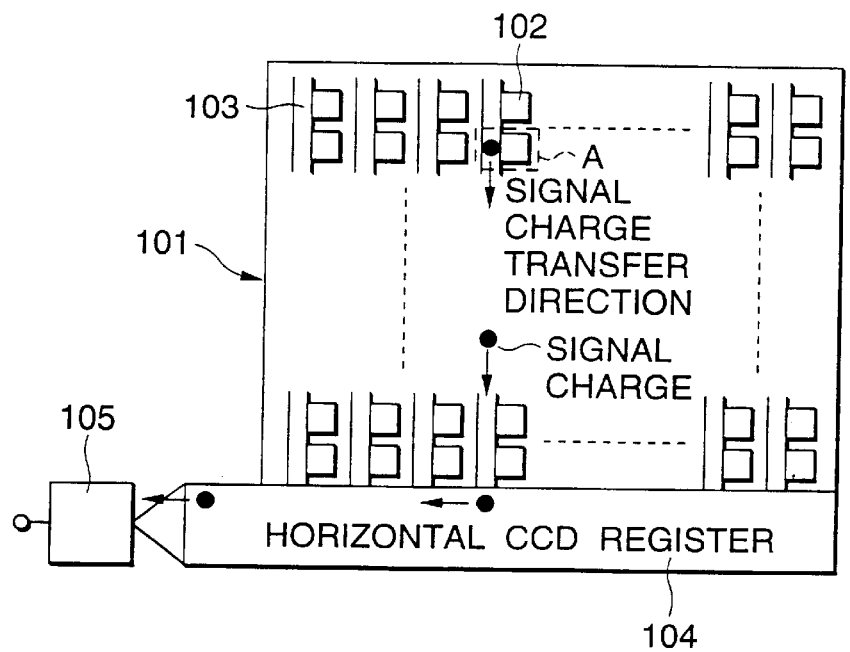
FIG. 1 is a schematic diagram showing the entire configuration of an interline transfer CCD solid-state imaging device.
Figure 2:
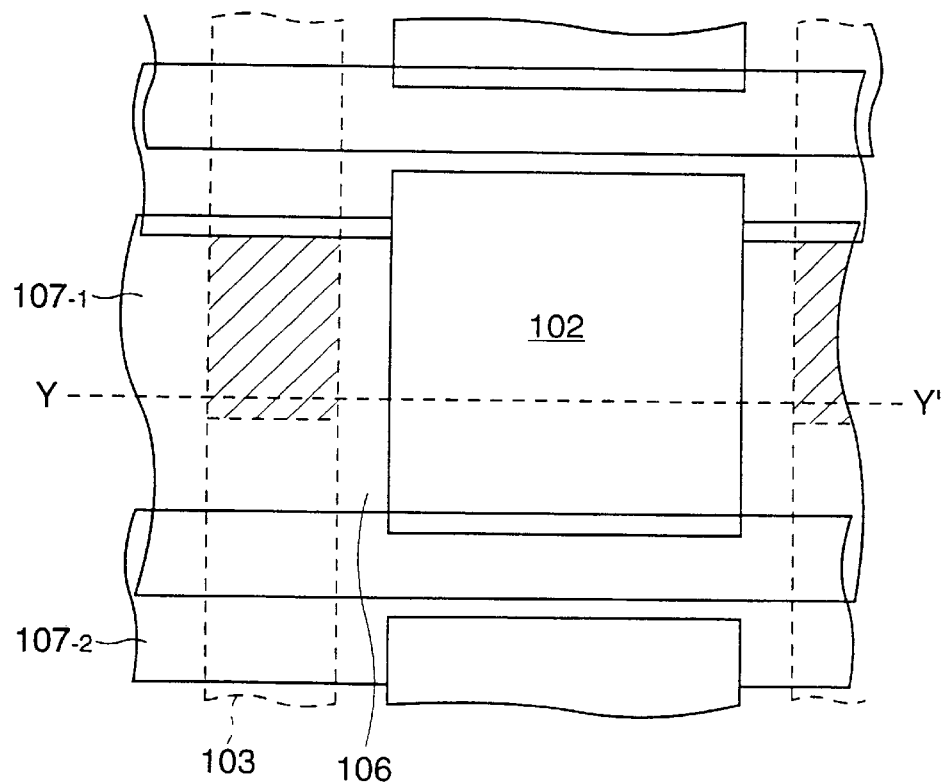
FIG. 2 is a plan pattern diagram showing the configuration of one photosensor and its peripheral portion.
Figure 3:
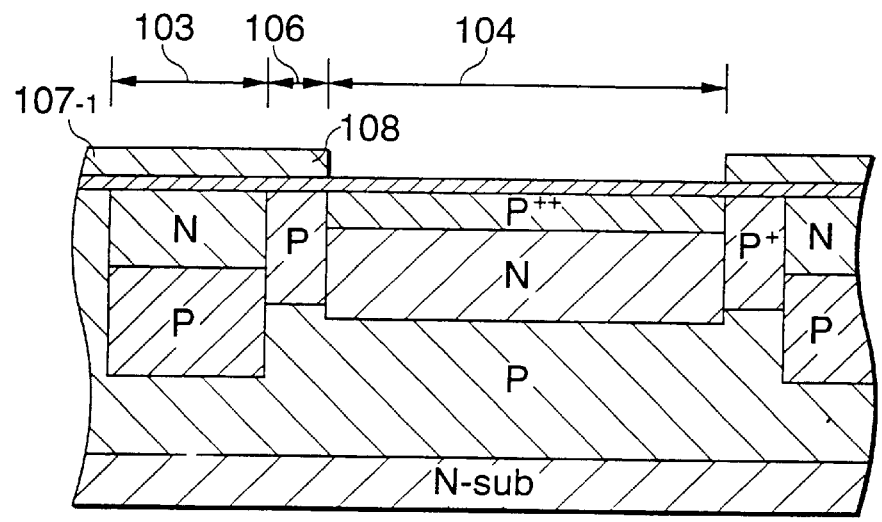
FIG. 3 shows a sectional structure taken along line Y–Y' in FIG. 2.
Figure 4:
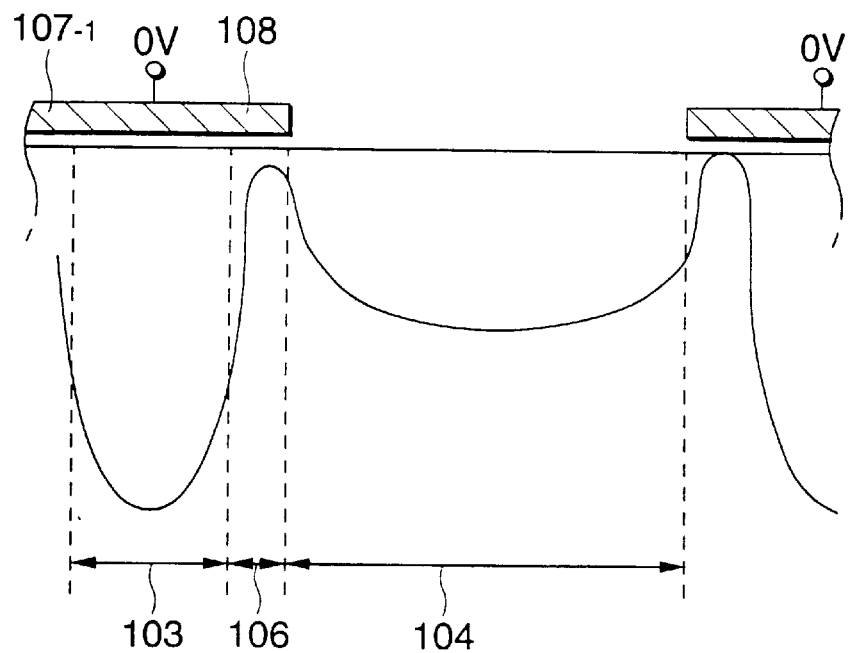
FIG. 4 is a potential diagram of the photosensor and its peripheral portion shown in FIG. 2.
Figure 5:
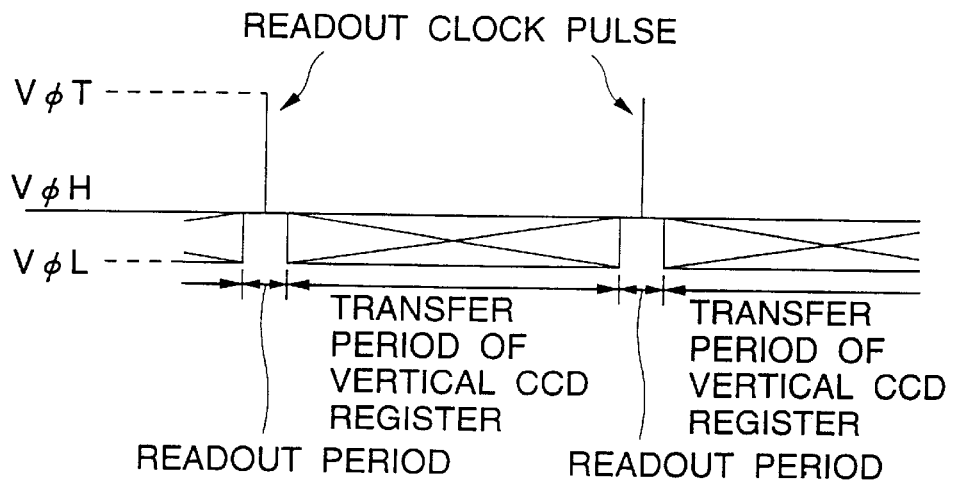
FIG. 5 shows waveforms of a vertical transfer pulse signal and a readout clock pulse signal.
Figure 6A:
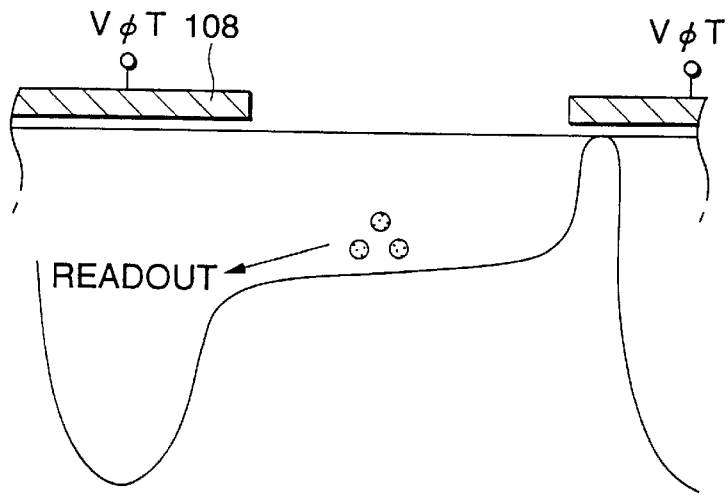
FIGS. 6(A) and 6(B) show potential profiles in a signal charge readout period and in a vertical transfer period, respectively.
Figure 6B:
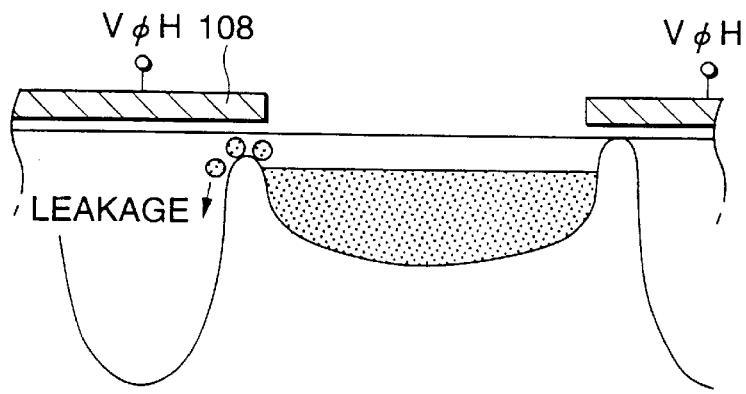
Figure 7A:
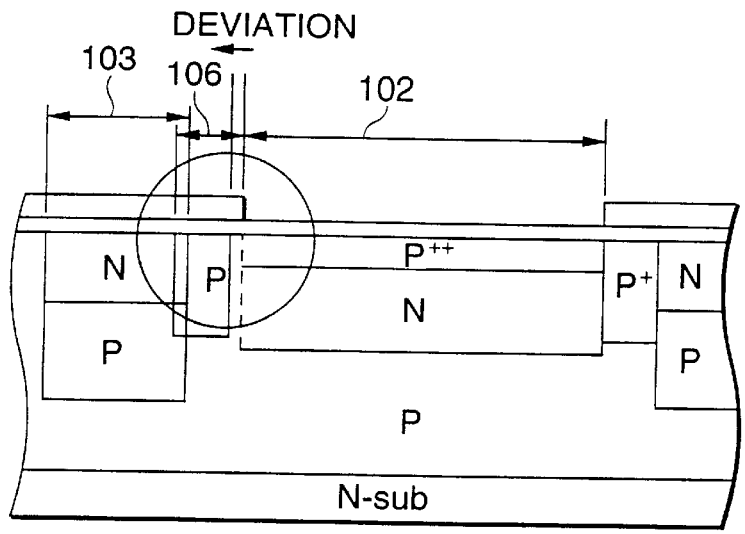
FIGS. 7(A) and 7(B) illustrate a first problem of a comparative example.
Figure 7B:
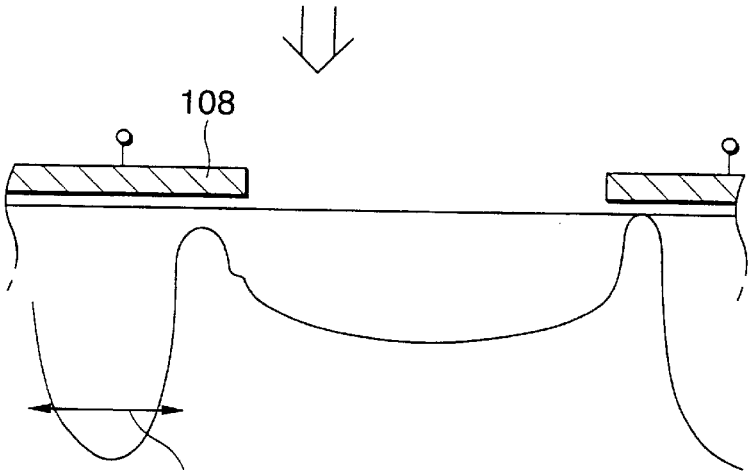
Figure 8A:
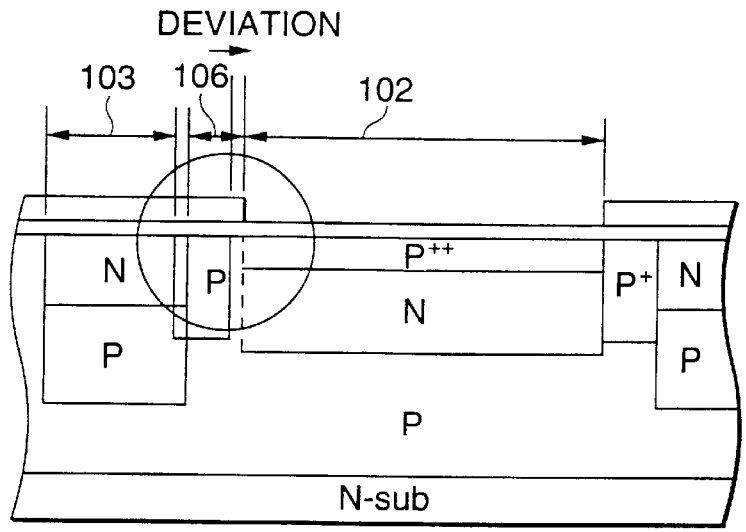
FIGS. 8(A) and 8(B) illustrate a second problem of the comparative example.
Figure 8B:
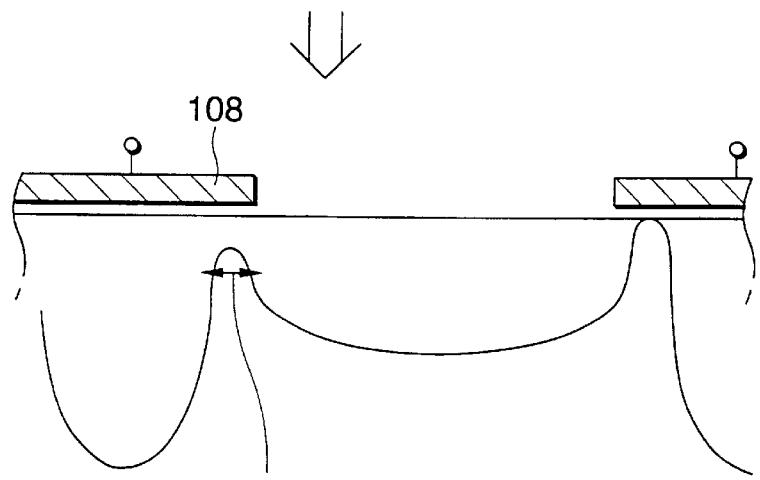
Figure 9:
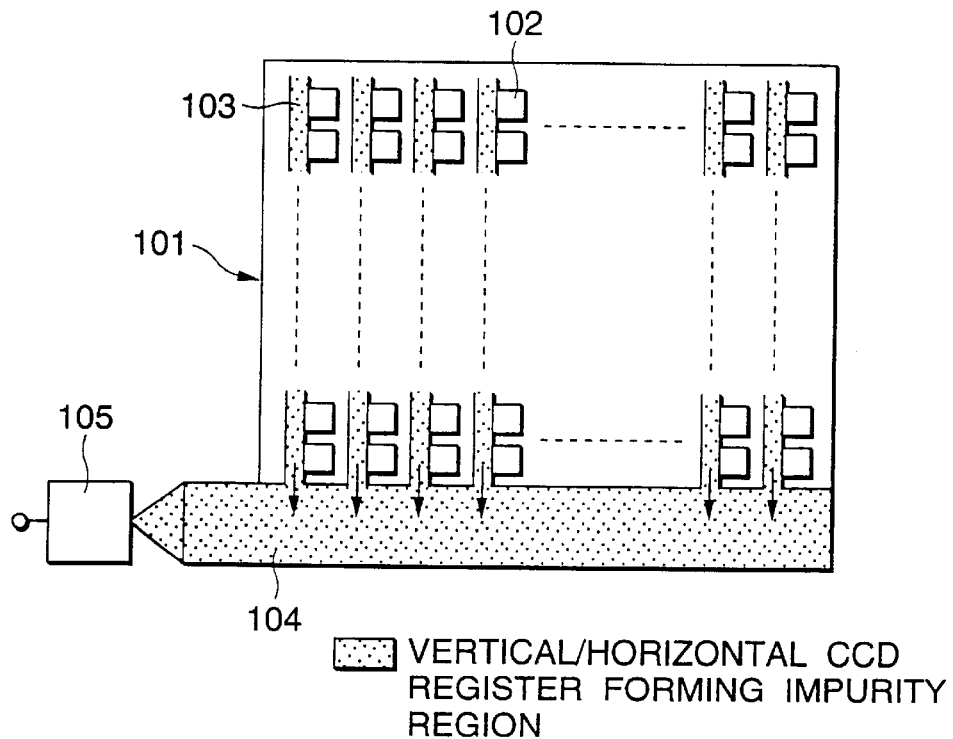
FIG. 9 shows an impurity implantation method according to another comparative example.
Figure 10A:
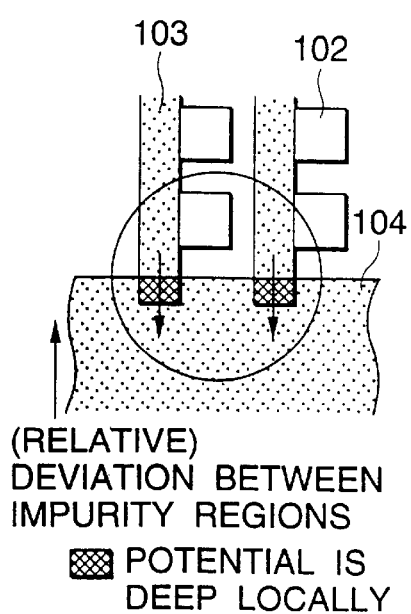
FIGS. 10(A) and 10(B) are enlarged views of the main part of FIG. 9 and illustrate problems that may occur when the impurity regions of vertical CCD registers deviate to the horizontal CCD register side and when gaps are formed between the vertical CCD registers and the horizontal CCD register, respectively.
Figure 10B:
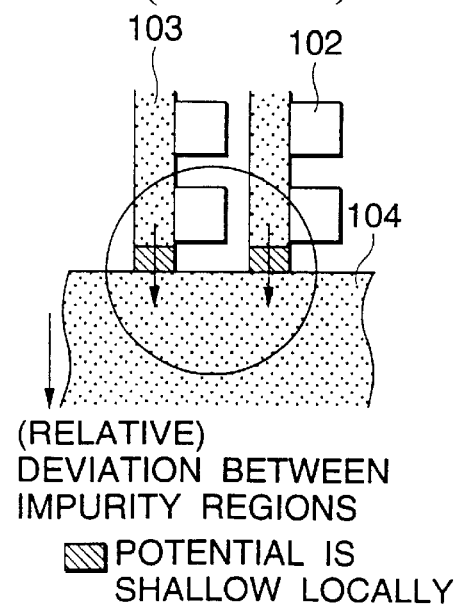
Figure 11:
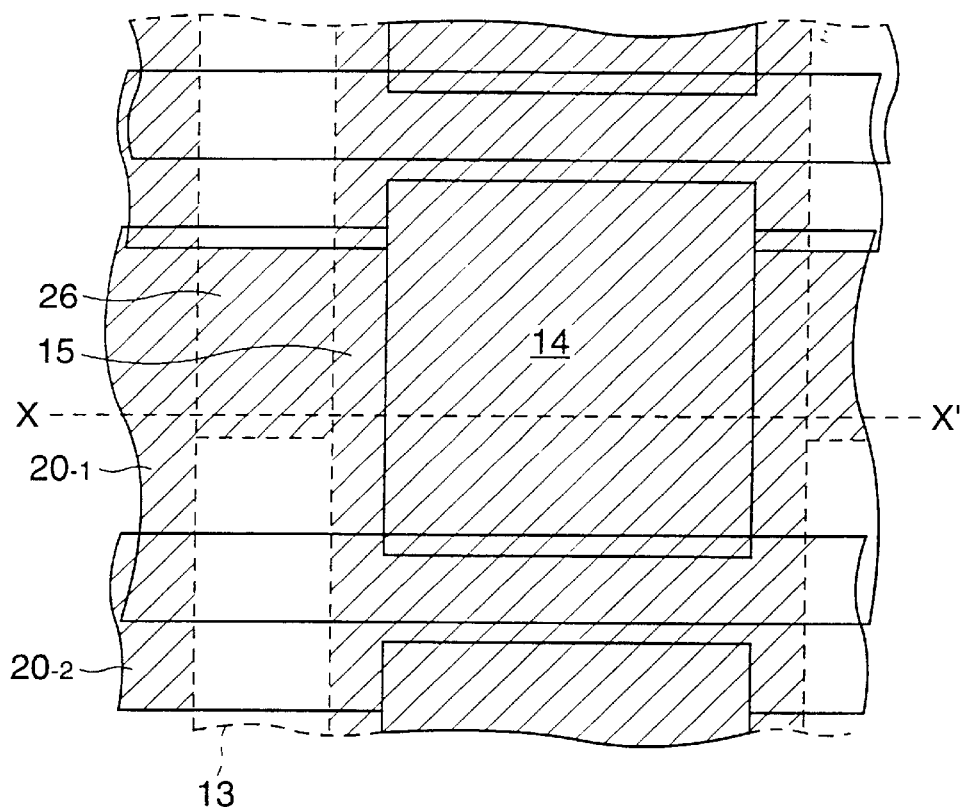
FIG. 11 is a plan pattern diagram showing the main part of a CCD solid-state imaging device according to an embodiment of the present invention.
Figure 12:
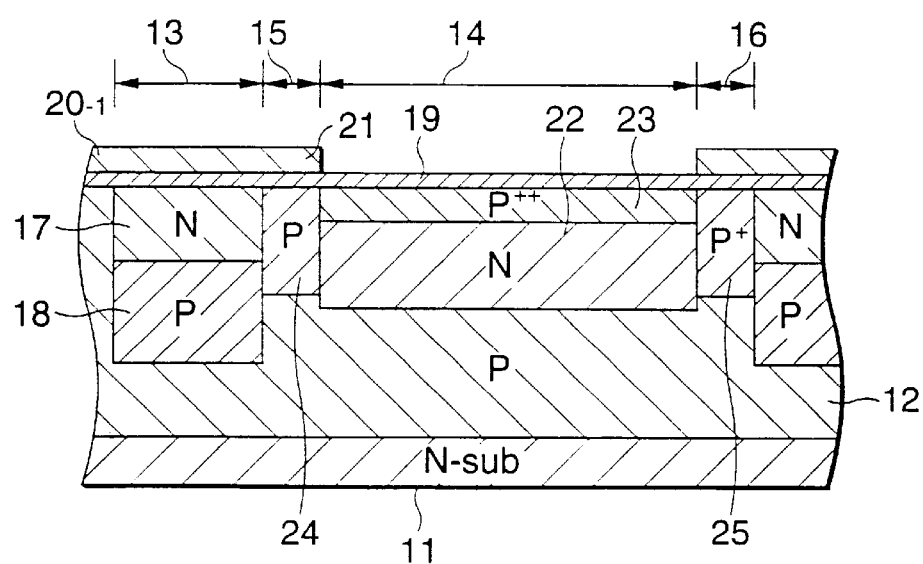
FIG. 12 shows a sectional structure taken along line X–X' in FIG. 11.

FIG. 11 is a plan pattern diagram showing the main part of a CCD solid-state imaging device according to an embodiment of the invention, and FIG. 12 shows a sectional structure taken along line X–X' in FIG. 11. As shown in FIGS. 11 and 12, the CCD solid-state imaging device according to this embodiment has a pixel structure in which a vertical CCD register 13, a photosensor 14, a readout gate section 15, and a channel stop section 16 for separating adjacent pixels from each other are buried in a first p-well 12 that is formed in an n-type substrate 11.

The vertical CCD register 13 is composed of an n-type impurity layer 17 that is buried on the surface side, a second p-well 18 that is formed under the n-type impurity layer 17 and first-layer and second-layer transfer electrodes 20-1 and 20-2 that are formed with an insulating film 19 interposed in between.

In the vertical CCD register 13, the n-type impurity layer 17 is a region for transferring signal charges. On the other hand, the second p-well 18 is formed to inhibit occurrence of a smear. The first-layer transfer electrode 20-1 also serves as a gate electrode 21 of the readout gate section 15.

The photosensor 14 is an np photodiode in which an n-type impurity layer 22 is formed in the first p-well 12, and has a HAD (hole accumulated diode) sensor structure in which a $p^{++}$ impurity layer 23 as a hole accumulation layer is formed on the substrate surface side. The readout gate section 15 is composed of a p-type impurity layer 24 and the gate electrode 21 that is formed above the p-type impurity layer 24. The channel stop section 16 comprises a $p^+$ impurity layer 25.

Next, a description will be made of how the potential of the region under the gate electrode 21 of the readout gate section 15 is set in the above pixel structure of the CCD solid-state imaging device according to the embodiment.

First, the potential of the region under the gate electrode 21 of the readout gate section 15 should be set at such a value that complete signal charge readout is assured in the signal charge readout period while signal charge leakage from the photosensor 14 to the vertical CCD register 103 is absolutely prevented in the transfer period of the vertical CCD register 13.

This potential is determined by the impurity concentration of the p-type impurity layer 24. In this embodiment, to implant an impurity into this region at a concentration suitable for the above potential setting, an impurity is implanted there and into the photosensor 14 at the same time by utilizing a step of implanting an impurity for another purpose, for example, a step of implanting an impurity for increase of the transfer efficiency of the vertical CCD register 13. The impurity implantation region has a pattern that is hatched in FIG. 11.

Here, the impurity for increase of the transfer efficiency of the vertical CCD register 13 means an impurity that is implanted to form a potential gradient in which the potential decreases in the signal charge transfer direction for each transfer stage of the vertical CCD register 13. In FIG. 11, a hatched region 26 in the vertical CCD register 13 is the implantation region that contributes to increase of the transfer efficiency.

Incidentally, the potential of the photosensor 14 is determined by the concentrations of photosensor forming impurities, that is, impurities of the n-type impurity layer 22 and the $p^{++}$ impurity layer 23, that are implanted in a step that is executed after the step of implanting the impurity for improvement of the transfer efficiency of the vertical CCD register 13. However, in the embodiment, the impurity for setting the potential of the region under the gate electrode 21 of the readout gate section 15 is implanted before the photosensor forming impurities are implanted. Therefore, in the photosensor forming step, the impurities may be implanted at concentrations that are corrected for the concentration of the impurity for setting the potential of the region under the gate electrode 21.

As described above, in this embodiment, the readout gate sections 15 are formed and the potential of the regions under the gate electrodes 21 is set by implanting an impurity there and into the photosensors 14 at the same time. Therefore, free of the problem of the misregistration of photomasks as described in the background section, the embodiment can set the potential of the regions under the gate electrodes 21 at an optimum value. Therefore, the embodiment can decrease the rates of occurrence of the failure of leakage of signal charge from the photosensors 14 to the vertical CCD registers 13 during the transfer period of the vertical CCD registers 13 and the failure in reading out signal charges from the photosensors 14 to the vertical CCD registers 13 during the signal charge readout period.

Further, the simultaneous impurity implantation into the photosensors 14 and the readout gate sections 15 is performed by utilizing a step of implanting an impurity for another purpose, for example, the step of implanting an impurity for increase of the transfer efficiency of the vertical CCD registers 13. Therefore, the potential of the regions under the gate electrodes 21 can be set close to the optimum value without increasing the number of steps, that is, with the same number of steps as in the case described in the background section.

Figure 13:
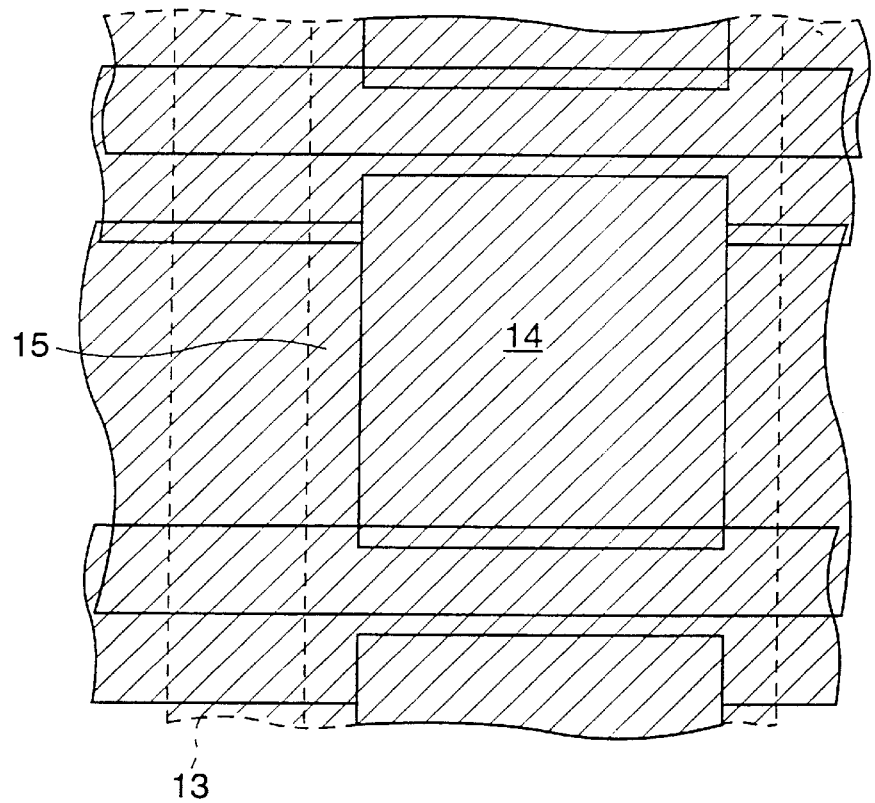
FIG. 13 is a plan pattern diagram showing the main part of a CCD solid state imaging device according to another embodiment of the invention.

Although in the above embodiment the readout gate sections 15 are formed by implanting an impurity there and into the photosensors 14 at the same time by utilizing a step of implanting an impurity for another purpose, for example, the step of implanting an impurity for increase of the transfer efficiency of the vertical CCD registers 13, it is possible to expand the impurity implantation region so as to cover the entire region of each vertical CCD register 13 (hatched in FIG. 13) and form the readout gate sections 15 by implanting an impurity there and into the vertical CCD registers 13 and the photosensors 14 at the same time.

This makes it possible to control the potential of the vertical CCD registers 13 by the concentration of the impurity that is implanted to the above regions at the same time. The potentials of the vertical CCD registers 13 and the horizontal CCD register 27, which were equalized by the simultaneous impurity implantation using the same mask (bottom-left-to-top-right hatching in FIG. 14), can be made different from each other by additionally implanting an impurity into the vertical CCD registers 13 as indicated by top-left-to-bottom-right hatching in FIG. 14.

Figure 14:
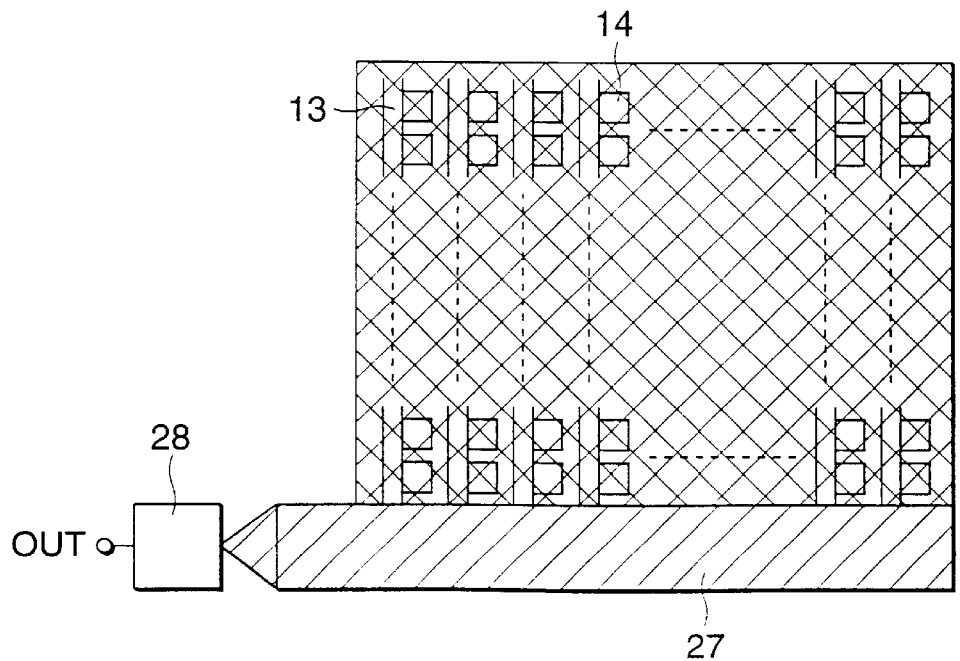
FIG. 14 is a schematic diagram showing the entire configuration of the CCD solid-state imaging device of FIG. 13.

Making the potentials of the vertical CCD registers 13 and the horizontal CCD register 27 different from each other allows the two potentials to be adjusted independently of each other so as to come close to optimum values. Therefore, the transfer efficiency of and the amount of charge to be handled by the vertical CCD registers 13 can be increased. Similarly, the transfer efficiency of and the amount of charge to be handled by the horizontal CCD register 27 can be increased. In FIG. 14, reference numeral 28 denotes a charge detection section having the floating diffusion amplifier configuration, for example.

As described above, according to the invention, since the potential of the regions under the gate electrodes are set by implanting an impurity into the readout gate sections and the photosensors at the same time, the potential of the readout gate sections can be set at an optimum value without being influenced by misregistration of photomasks. Therefore, the rates of occurrence of the failure of leakage of signal charge from the photosensors to the vertical transfer registers during the vertical transfer period and the failure in reading out signal charges from the photosensors to the vertical transfer registers during the signal charge readout period can be decreased.

Further, by implanting an impurity into the vertical transfer registers and the readout gate sections at the same time, the potential of the vertical transfer registers can be set at its own optimum value separately from the horizontal transfer register. The transfer efficiency of and the amount of charge to be handled by each of the vertical transfer registers and the horizontal transfer register can be increased.

What is claimed is:

1. A manufacturing method of a state-state imaging device having a plurality of photosensors arranged in columns, readout gate sections having gate electrodes with a length, the gate electrodes provided adjacent to the respective photosensors for reading out signal charges produced by the respective photosensors through photoelectric conversion, and transfer registers provided in parallel with columns of photosensors for transferring signal charges read out by the readout gate sections, the manufacturing method comprising the step of:

forming the readout gate sections by implanting an impurity into readout gate section forming regions under the length of the gate electrodes and photosensor forming regions of a substrate at the same time in a device forming step in which an impurity is implanted into the substrate.

2. The manufacturing method according to claim 1, wherein the impurity is implanted into the readout gate section forming regions and the photosensor forming regions at the same time by utilizing a step of implanting an impurity into another region of the substrate.

3. The manufacturing method according to claim 2, wherein the step of implanting an impurity into another region of the substrate is a step of implanting an impurity for increase of transfer efficiency into transfer register forming regions.

4. The manufacturing method according to claim 1, wherein in forming the readout gate sections the impurity is also implanted into transfer register forming regions at the same time.

5. A manufacturing method of a state-state imaging device having a plurality of photosensors arranged two-dimensionally in matrix form, readout gate sections having gate electrodes with a length, the gate electrodes provided adjacent to the respective photosensors for reading out signal charges produced by the respective photosensors through photoelectric conversion, a plurality of vertical transfer registers provided for respective columns of the photosensors for transferring signal charges read out by the readout gate sections, and a horizontal transfer register provided perpendicularly to the plurality of vertical transfer registers, the manufacturing method comprising the step of:

forming the readout gate sections by implanting an impurity into readout gate section forming regions under the length of the gate electrodes and photosensor forming regions of a substrate at the same time in a device forming step in which an impurity is implanted into the substrate.

6. The manufacturing method according to claim 5, wherein the vertical transfer registers and the horizontal transfer register are formed by implanting an impurity into the substrate by using the same mask.

7. The manufacturing method according to claim 6, wherein in forming the readout gate sections the impurity is also implanted into vertical transfer register forming regions at the same time.

8. The manufacturing method according to claim 5, wherein in forming the readout gate sections the impurity is also implanted into vertical transfer register forming regions at the same time.

9. The manufacturing method according to claim 5, wherein the impurity is implanted into the readout gate section forming regions and the photosensor forming regions at the same time by utilizing a step of implanting an impurity into another region of the substrate.

10. The manufacturing method according to claim 9, wherein the step of implanting an impurity into another region of the substrate is a step of implanting an impurity for increase of transfer efficiency of the vertical transfer registers.

* * * * *